(12) United States Patent
Chakraborty et al.

(10) Patent No.: US 7,047,163 B1
(45) Date of Patent: May 16, 2006

(54) METHOD AND APPARATUS FOR APPLYING FINE-GRAINED TRANSFORMS DURING PLACEMENT SYNTHESIS INTERACTION

(75) Inventors: Kanad Chakraborty, Mt. Arlington, NJ (US); Wilm Ernst Donath, New York, NY (US); Prabhakar Nandavar Kudva, White Plains, NY (US); Lakshmi Narasimha Reddy, Ossining, NY (US); Leon Stok, Croton-on-Hudson, NY (US); Andrew James Sullivan, Wappingers Falls, NY (US); Paul Gerard Villarrubia, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/524,408

(22) Filed: Mar. 13, 2000

(51) Int. Cl.
  *G06F 17/10* (2006.01)
  *G06F 7/60* (2006.01)
  *G06F 15/18* (2006.01)
  *G06G 7/00* (2006.01)
  *G06N 3/00* (2006.01)

(52) U.S. Cl. .................. 703/2; 706/7; 706/12; 706/13; 706/14

(58) Field of Classification Search .................. 703/2, 703/13; 716/7, 8, 12, 13, 14
See application file for complete search history.

(56) References Cited

U.S. PATENT DOCUMENTS

| | | | |
|---|---|---|---|
| 5,113,352 A | 5/1992 | Finnerty | |
| 5,461,576 A | 10/1995 | Tsay et al. | |
| 5,508,937 A * | 4/1996 | Abato et al. | 716/6 |
| 5,666,290 A | 9/1997 | Li et al. | |
| 5,757,657 A * | 5/1998 | Hathaway et al. | 710/9 |
| 5,953,236 A | 9/1999 | Hossain et al. | |
| 6,026,226 A * | 2/2000 | Heile et al. | 716/12 |
| 6,314,552 B1 * | 11/2001 | Markov | 716/18 |
| 6,378,114 B1 * | 4/2002 | Shenoy et al. | 716/7 |
| 6,446,239 B1 * | 9/2002 | Markosian et al. | 716/2 |
| 6,449,761 B1 * | 9/2002 | Greidinger et al. | 716/11 |

OTHER PUBLICATIONS

HDL Chip Design, by Douglas J. Smith, Dune Publications, 1996, pp. 2-19.*
Donath, W. Kudva, P. Stok, L. Villarrubia, P. Reddy, L. Sullivan, A. "Transformational placement and synthesis" Design Automation and Test in Europe Conference and Exhibition 2000, Proceedings, ISBN 0-7695-0537-6, Mar. 27, 2000, 8 pages.*

* cited by examiner

*Primary Examiner*—Paul L. Rodriguez
*Assistant Examiner*—Dwin M. Craig
(74) *Attorney, Agent, or Firm*—Satheesh Karra, Esq.; McGinn IP Law Group, PLLC

(57) ABSTRACT

A method (and system) of applying transforms for modifying a plurality of domains concurrently in a design space, includes creating a sequence of more and less granular placement and netlist modification transforms. A converging design process flow is created by a flexible mechanism in which a select combination of fine-grained transforms are applied to optimize the netlist and placement of a design.

12 Claims, 5 Drawing Sheets

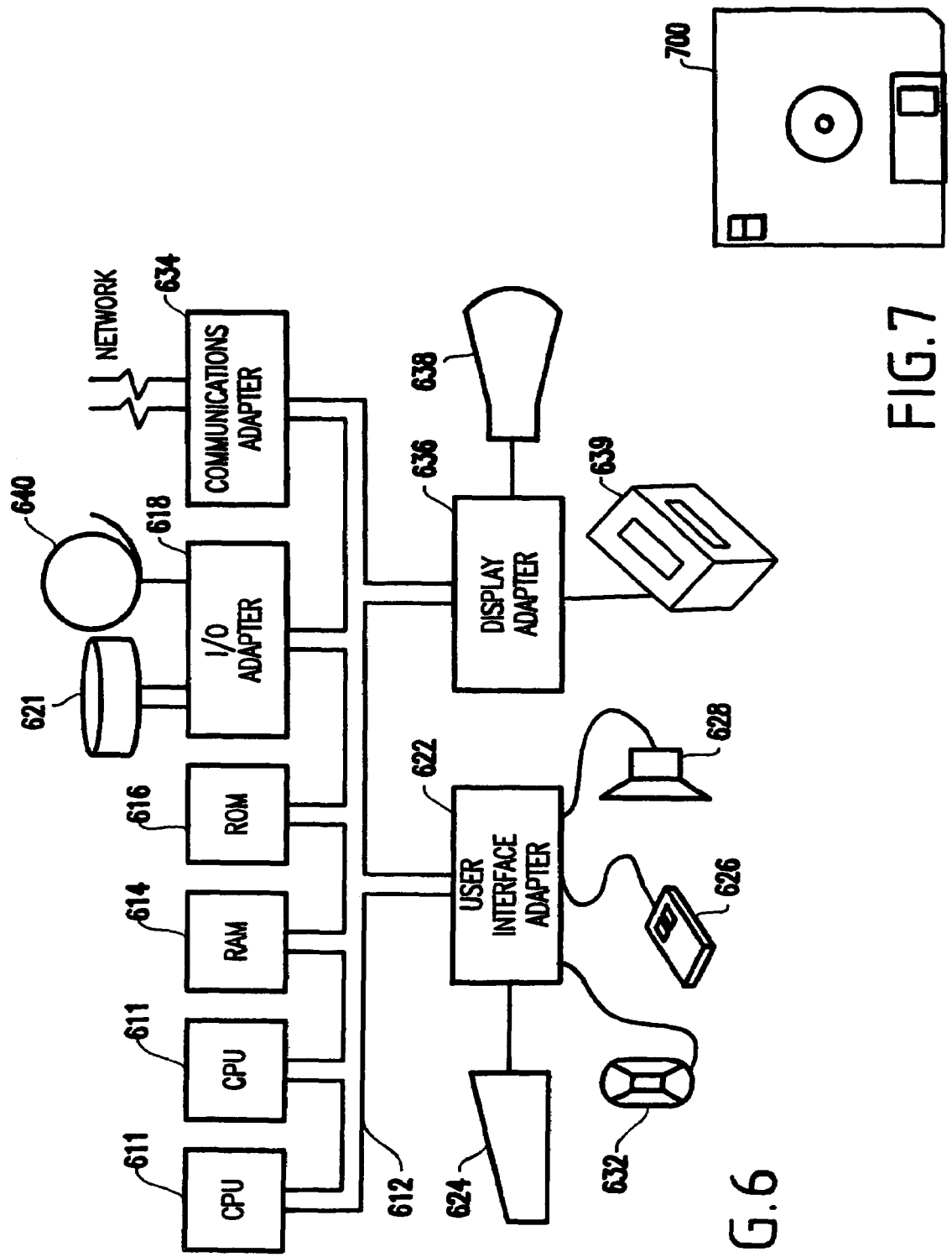

METHOD AND APPARATUS FOR APPLYING FINE-GRAINED TRANSFORMS DURING PLACEMENT SYNTHESIS INTERACTION

BACKGROUND OF THE INVENTION

1. Field of the Invention

The present invention relates to a novel infrastructure and method to seamlessly integrate logic synthesis and physical placement through a transformational approach, and more specifically to a method and apparatus for applying fine-grained transformations during placement synthesis interaction.

2. Description of the Related Art

Typically, in chip design, several steps are performed in sequence including a high level synthesis step for creating a register transfer level representation of the design, a logic synthesis step for automatically creating a circuit from the register transfer level description, a placement step to place the circuits on the chip, a routing step for routing the placed design and finally fabrication can be performed. Traditionally, logic synthesis and placement have been two separate steps.

Recently, attempts to combine these two design steps (logic synthesis and placement) have been made. However, performing these steps in combination (at the same time) is problematic. That is, it is difficult to design the logic since it is unknown where the circuit will be placed on the wafer, and hence connection is uncertain. For example, the length of the wires is not known and thus the logic design cannot be performed with certainty. Thus, many assumptions must be made which are typically incorrect.

Further, timing optimization in traditional logic synthesis is based on a transformational approach. A netlist (an interconnected schematic of gates) is gradually modified and refined. Timing, noise and power analyzers incrementally measure the design and provide feedback to the transforms (e.g., algorithms) that make the actual design changes (e.g., see Stok et al., "Booledozer: logic synthesis for asics, *IBM Journal of Research and Development* (July 1996)). For example, the timing analyzer analyzes the timing of the proposed circuits placed on the chip. An evaluator (or the transform itself) queries the analyzers and decides if the design actually improves and accepts/rejects the netlist modifications based on whether the design is improved.

The advantage of the above approach is that direct feedback from the analyzer(s) is used in the synthesis optimizations. There is a direct coupling between the analyzers used for the final sign-off criteria and the optimization. This direct coupling allows discrete logic and electrical netlist optimizations within synthesis.

Algorithms for placement of circuits on the chip have the advantage of a rigid underlying mathematical formulation. They have been very successful in optimizing net length and controlling wire congestion and their complexities scale well to handle larger designs. Most placement algorithms use continuous formulations (i.e., the placement problem is formulated as a continuous mathematical optimization problem) and hence do not lend themselves to discrete optimizations (e.g., such as buffer insertion, pin swapping, etc.) typically used in synthesis.

Timing-driven placement techniques have often used the ability to specify constraints into the placement algorithm such as net weights and capacitance targets to achieve such goals (e.g., see Donath et al., "Timing driven placement using complete path delays", In Proc. ACM/IEEE Design Automation Conference (June 1990), IEEE Computer Society Press); Sarrafzadeh et al., "Unification of budgeting and placement", Proc. ACM/IEEE Design Automation Conference (1997), 758–761); and Kleinhans et al., "Gordian: VLSI placement by quadratic programming and slicing optimization", *IEEE Transactions on Computer-Aided Design* (1991), 356–365). However, they do not directly take into account feedback from, for example, a timing analyzer because the placement problem is formulated with the objective of minimizing total wire length. These techniques formulate their problems as continuous optimization problems, and hence do not lend themselves easily to include netlist transformations which are discrete in nature (e.g., buffer insertion, remapping, pin swapping etc.).

Including these objectives directly in the problem formulation leads to expensive optimization algorithms. In Srinivasan et al., "RITUAL: A performance driven placement algorithm for small cell ICs", In Proc. International Conf. Computer-Aided design (ICCAD) (November 1991), pp. 48–51), locations are specified as variables for timing improvement and an exact non-linear optimization problem is formulated to achieve this goal. However, the runtime of non-linear methods tends to grow quickly with the size of the designs.

A typical conventional approach has been to use a snap-shot of placement as a starting point for netlist transformations, followed by an incremental placement step (e.g., see Kannan et al., "A methodology and algorithms for post-placement delay optimization", In Proc. ACM/IEEE Design Automation Conference (June 1994), IEEE Press); Lee et al., "Incremental timing optimization for physical design by interacting logic restructuring and layout", International Workshop in Logic Synthesis (1998), 508–513); Lou et al., "Exact solution to simultaneous technology mapping and linear placement problem", Proc. International Conf. Computer-Aided Design (ICCAD) (1997)) and Murofushi et al., "Layout driven re-synthesis for low power consumption Isis", In Proc. ACM/IEEE Design Automation Conference (June 1997), IEEE Press) to legalize the perturbations caused by the netlist transforms. These approaches significantly limit the netlist changes that can be made to be able to maintain incrementality in the succeeding placement.

In one approach referred to as "POINT" (e.g., see Stenz et al., "Timing driven placement in interaction with netlist transformations", Proc. International Symposium on Physical Design (1997)), the approach is extended by adding a flow-based placement improvement phase as a legalization step, thereby increasing the number and scope of network changes that can be tolerated. In Hojat et al., "An integrated placement and synthesis approach for timing closure of PowerPC microprocessors", Proc. International Conf. Computer Design (ICCD) (1997), pages 206, 210), a methodology that enables one to invoke synthesis transforms in the intermediate steps of a partitioning based placer is described.

All of these approaches start from an existing placement and only try to optimize around this initial local minimum.

FIG. 1 illustrates a three-axes graph which serves to describe how the traditional methods allow for placement synthesis integration. In FIG. 1, it is shown that as optimizations may be made in one domain, the other two domains will be affected. That is, the conventional methods looked at each domain in sequence, and not all at the same time. Thus, for example, typically first the boolean design will be optimized, then the electrical design will be optimized, and finally the placement of the circuit on the chip will be optimized. Such a sequential operation leads to inefficiency.

Hence, in FIG. 1, the three axes represent optimizations along boolean, electrical and physical domains. Each step (e.g., changes made in each domain) or algorithm moves the design from one point in the design space to another. In the traditional flows, netlist optimizations (such as cloning, buffer insertion, etc.) are alternated with placement steps (including techniques well known in the art such as min-cut partitioning, reflow, etc.)

Such steps are shown as AB, BC, CD, DE and EF. However, in this flow, numerous steps are required to go from point A to point F. The sequential optimization constrains the design to go from point A to point B, to point C etc. This constraining is forced on each of the tools since, for example, the boolean optimizer knows nothing of the electrical properties which the electrical optimizer must optimize, and the electrical optimizer knows nothing of the physical properties which the physical optimizer must optimize. In typical chip design methodologies, the logic synthesis and placement step are split into two parts. Hence, guesswork is involved.

Thus, no single step may optimize the physical, boolean and electrical dimensions, thus moving the design from point A to F in the design space. Further, a more optimal design point F' is missed by the optimization process due to the inability to evaluate and optimize the three dimensions at once. Using the methods of the invention, one is able to evaluate various points including F' directly. Thus, for example, in the conventional method, a remapping step where a complex gate is broken down into simpler gates will not optimize multiple objectives simultaneously (e.g., by choosing the physical locations of the simpler gates, the sizes and electrical gains of the chosen gates and the topology of boolean function, etc.).

Hence, the conventional methods are constrained by each step not knowing what the next step in the sequence is going to do.

In a first conventional method, nets are weighted during successive partitioning stages of placement. The goal is to use the electrical information by apportioning the slack weights according to the timing debt during the min-cut partitioning process. Logic design is performed during the intermediate stages of such a min-cut partitioning process.

However, this first method has placement and logic redesign which are alternate steps in an iteration. There is no consideration let alone recognition that a single fine grained step which may comprise of multiple objectives and constraints which involve both physical (placement), electrical and logical data, would be useful or efficient. Further, the logic redesign step is applied in a given "cut depth". Thus, there is a distinction between a placement and synthesis step. Hence, in this method, no step may move the circuit from one design space (both physical and logical) to another.

Moreover, this first conventional method is unable to use a partially placed and synthesized design as the starting point. Hence, an incremental netlist and physical design improvement is not possible in this method. Additionally, in this first conventional method, the flow is not a single converging flow of successive application of fine grained steps. Instead, this method merely uses an iteration of partial placement and partial logic redesign steps. Finally, this first conventional method is not based on the infrastructure of bins, and therefore is unable to allow for quick logic redesign with placement. Moreover, there is no ability to externally control the logic/placement redesign using scenarios.

In a second conventional method, a layout of an integrated circuit design is provided, which includes placing cells, followed by verification of the timing in the layout area. If the timing does not verify, a means is provided for modifying the netlist and making an ECO change of the placement to reflect this new netlist followed by placement iteration. The second method is also directed to placement of results of the behavioral synthesis.

However, this second method is problematic in that there are no placement and netlist changes (synthesis) performed together in the form of fine-grained transforms. Moreover, there is no timing verification which is internal to both the placement and synthesis algorithms leading to a converging placement/netlist change flow. Moreover, the step of making netlist changes followed by ECO placement is inefficient and unnecessary.

In a third conventional method, a net weighting algorithm is provided to influence a min-cut-based placement program to meet timing and improve area and total wire length while performing placement. The key idea is to assign weights to critical nets based on the current timing violations and to non-critical nets based on the difference between the maximum allowed and the current estimated capacitances. Additionally, a propagation delay estimation technique is provided for the nets on the critical path, and a weighting technique of driver/buffer pairs is provided for ensuring that the most sensitive nets are kept short.

However, this third conventional method is deficient in that placement and netlist changes are not performed concurrently. Further, the placement program is not incremental in nature and there is no option, at every step, of intercepting the placement program and experimenting with a range of netlist change transforms (that are more effective than net weighting), for improving the design.

Finally, in a fourth conventional method, a timing slack graph is generated to provide communication between a placement tool and a timing constraint generator. The slack graph, used in conjunction with a timing calculator and a net bounding box model, converts timing constraints into placement constraints. Path timing constraints are concurrently handled by imposing physical constraints on the placement.

However, this fourth conventional method is problematic in that it performs only placement changes. Hence, timing is not constructively improved by concurrently applying both placement and netlist changes.

Thus, the conventional techniques have serious drawbacks which lead to inefficiency and complex, time-consuming computations and expenditure of system resources.

SUMMARY OF THE INVENTION

In view of the foregoing and other problems, disadvantages, and drawbacks of the conventional methods and structures, an object of the present invention is to provide a method and structure for optimizing a design.

Another object is to provide a method and structure for optimizing a design in which each of a plurality of properties of a plurality of domains (objectives) are considered simultaneously.

In a first aspect of the present invention, a method (and system) of applying transforms for modifying a plurality of domains concurrently in a design space, includes creating a sequence of more and less granular placement and netlist modification transforms to create a converging design. The transforms include fine-grained transforms allowing selective mixing and matching of the fine-grained transforms to optimize the placement of a circuit in a design space.

In a second aspect, a method of applying fine-grained transformations during placement synthesis interaction, includes creating and updating bins, applying a plurality of transforms on a bin-based database updated by both placement and synthesis, updating the bin-based timing, and invoking a synthesis-placement script, selecting fine-grained synthesis and placement transforms, invoking selected transforms within said script using a driver, and applying transforms that change the physical, electrical and boolean logic design space concurrently.

With the unique and unobvious aspects of the present invention, the transformational placement and synthesis approach dramatically improves on the conventional techniques that integrate the logic synthesis and placement steps.

By creating a sequence of more and less granular placement and netlist modification transforms a converging design closure process is created, starting from just a netlist without initial placement.

The placement function is decomposed into a set of placement transforms each addressing a specific phase of the placement problem. Each placement step becomes just another transform that changes the design space, in this case the placement of cells. These placement transforms can be freely mixed and matched with the traditional logic synthesis transforms that change the netlist. The accuracy versus runtime tradeoff of these optimizations can be refined as the quality of the placement and netlist data improves in a converging flow.

Thus, returning to the example presented by FIG. 1, in the inventive flow, a single step may optimize the physical, boolean and electrical dimensions, thus moving the design from point A to F in the design space. Multiple steps are not required. Further, in the inventive flow, a more optimal design point F' in the design space may be reached. Thus, in the inventive method and system, a buffer insertion step may optimize multiple objectives simultaneously (e.g., in a remapping algorithm by choosing the physical locations of the new logic gates, the sizes and electrical gains of the gates and the topology of the logic, etc.).

Thus, the present invention improves the efficiency and quality of the design process and reduces the burden on system resources.

Additionally, in the invention, the placement and logic redesign are not alternate steps in an iteration. Instead, a single fine-grained step may include multiple objectives and constraints which involve both physical (placement), electrical and logical data. Further, the invention does not necessarily make any distinction between a placement and synthesis step. Any step may move the circuit from one design point (physical, electrical and logical) to another. Hence, with the invention, a partially placed and synthesized design can be the starting point. Along these lines, an incremental netlist and physical design improvement can be made using the invention.

Further, in the invention, the flow is a single converging flow of successive application of fine grained steps as opposed to an iteration of partial placement and partial logic redesign steps. Further, the invention is preferably based on the infrastructure of bins, which allows for quick logic redesign during placement. Moreover, the timing analysis method is based on the bin concept. The invention also allows for externally controlling the logic/placement redesign using scenarios.

Further, as mentioned above, placement and netlist changes (synthesis) are performed together in the form of fine grained transforms. Timing verification is internal to both the placement and synthesis algorithms leading to a converging placement/netlist change flow.

Hence, the invention performs placement and netlist changes concurrently. The placement program of the invention is incremental in nature and at every step, the invention has the option of intercepting the placement/synthesis flow and experimenting with a range of netlist and placement change transforms for improving the design.

BRIEF DESCRIPTION OF THE DRAWINGS

The foregoing and other purposes, aspects and advantages will be better understood from the following detailed description of a preferred embodiment of the invention with reference to the drawings, in which:

FIG. 6 illustrates an exemplary information handling/computer system 600 for use with the invention; and FIG. 7 illustrates a medium 700 for storing a program for implementing the method according to the present invention.

DETAILED DESCRIPTION OF THE PREFERRED EMBODIMENTS OF THE PRESENT INVENTION

Figure 1:
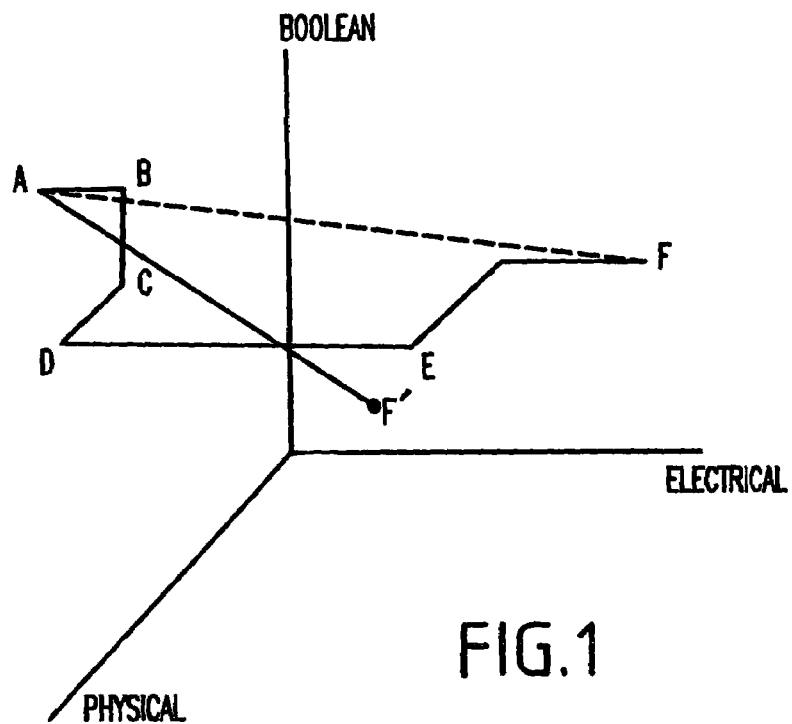
FIG. 1 illustrates fine-grained integration.

Referring now to the drawings, and more particularly to FIGS. 2–7, there are shown preferred embodiments of the method and structures according to the present invention.

First Embodiment

Referring to FIGS. 2–7, a first embodiment of the present invention will be described below.

As mentioned above, the invention examines a plurality of domains concurrently in finding an optimum design. That is, the inventive transformational placement and synthesis approach creates a sequence of more and less granular placement and netlist modification transforms (e.g., steps which change the design space from one point to another; there are boolean transforms, electrical transforms, and placement/physical transforms) thereby to create a converging design closure process, starting from just a netlist without initial placement.

The placement function is decomposed into a set of placement transforms each addressing a specific phase of the placement problem. Each placement step becomes just another transform that changes the design space, in this case the placement of cells. These placement transforms can be freely mixed and matched with the traditional logic synthesis transforms that change the netlist. Further novel transforms that optimize all three domains concurrently can be created. The accuracy versus runtime tradeoff of these optimizations can be refined as the quality of the placement and netlist data improves in a converging flow.

All transforms have a unified view (e.g., same perspective at a same time of the overall design space in question) of the placement and synthesis design space. Synthesis, timing, and placement algorithms and data are concurrently available to all transforms. This allows for an entire new class of transforms that modify the netlist and placement concurrently (e.g., which may allow, for example, going from design point A to design point F in the Example of FIG. 1 in a single step, or to a design point F').

In conventional techniques and systems, this has not been possible hitherto the present invention. A transform to eliminate wire congestion can do this both by moving cells or re-decomposing a piece of the netlist. An electrical correction transform can let its choice to clone a cell or buffer its output be decided by how much space is available to do one or the other.

Figure 2:
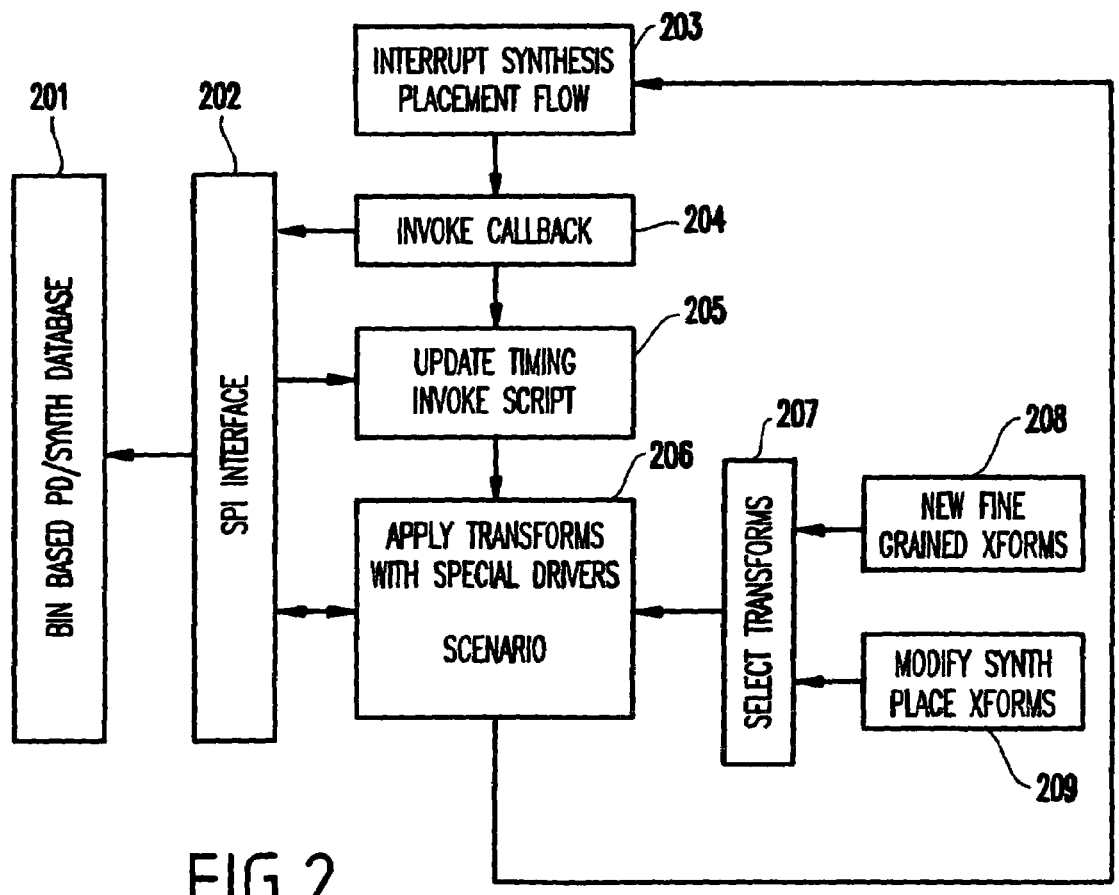
FIG. 2 illustrates a method for placement synthesis integration according to the present invention.
Figure 3:
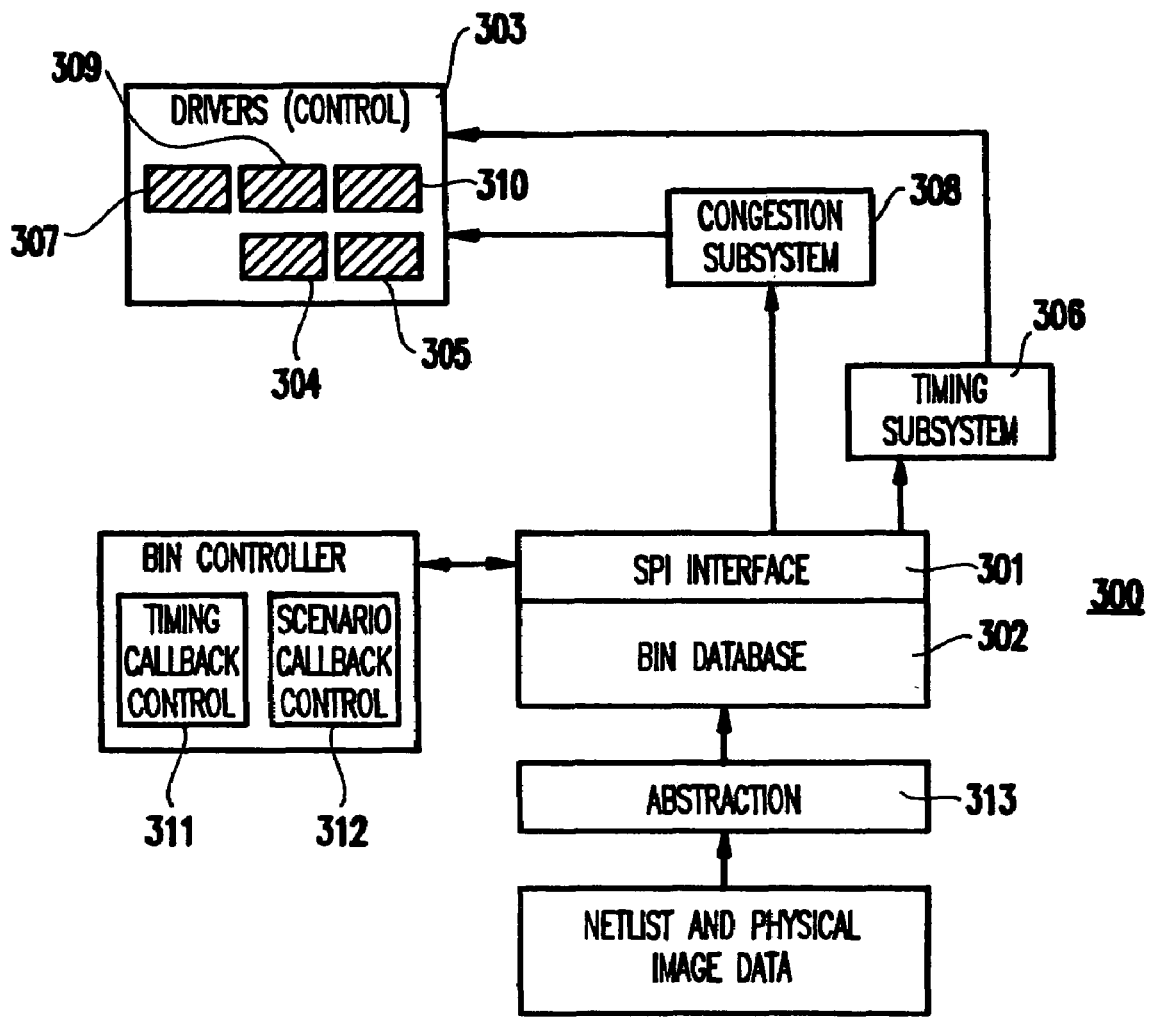
FIG. 3 illustrates a system for implementing the method of the present invention.

Referring to FIGS. 2 and 3, a method for placement synthesis integration and a functional block diagram of the infrastructure for performing the method of the invention, are respectively shown.

That is, the present invention provides a novel method (and apparatus) for applying fine-grained transformations during placement synthesis interaction, which includes (a) creating and updating of bins, (b) applying the transforms on a bin-based database updated by both placement and synthesis based on the infrastructure, (c) updating the bin-based timing, (d) invoking a synthesis-placement script, (e) selecting novel fine-grained synthesis/placement transforms, (f) invoking selected transforms within those scripts using a novel driver technique, (g) applying novel transforms that change the physical/electrical and boolean space concurrently, and repeating these steps (a) through (g) until design convergence.

Thus, for example, the invention moves the design space from one point to another by considering concurrently subsets of very fine-grained boolean, electrical, and physical transforms. The invention also integrates boolean optimizations, electrical optimizations and physical optimizations. Each of these optimizations are looked at concurrently within a single transformation. Also a plurality of such transformations (e.g., 100 transformations) are selected and applied during the design closure process. That is, in the inventive infrastructure, the optimizations are divided (e.g., into fine-grain transforms) and interspersed together, to look at each of the boolean, electrical and physical domains concurrently.

Looking at a concrete example, it is assumed that one is to remap a portion of a chip design. The invention can decide the new topology which is a boolean logic transformation, change the size of the gates in the new topology which is an electrical transformation, and decide the locations of where to insert the new gates (e.g., a physical transformation) all at the same time. Thus, the invention optimizes the design process by determining a transformation which takes into account each of a plurality of domains, to find an optimal design point.

Referring again to FIG. 2, a bin-based placement database (PD)/synthesis database is shown 201 coupled to a synthesis placement interface (SPI) 202 which acts as an intermediate layer (e.g., software layer) between the bin database and a transform (algorithm). A bin is a rough representation of the logical and physical space, and is essentially a database. The chip is typically divided into bins (e.g., 2048 bins), which hold logic and a rough (coarse) representation of where the chip is (or should be) located.

The interface 202 hides the details of the bin from the transform, and gives the information to the transform, and if the transform wants to make a change to the design space, then the transform applies the changes with respect to the bin database. Hence, transformations can be made quickly, since all that needs to be monitored is rough capacities (usages) of the bins.

Also included in FIG. 2 are a unit/module 203 for interrupting synthesis placement flow, a unit 204 for invoking a callback, a unit 205 for updating timing and invoking a custom script where a designer may choose to invoke a set of transforms, a unit 206 for applying transforms with special drivers, a unit 207 is used for selecting transforms, a unit 208 for inputting new fine-grained transforms, and a unit 209 for modifying existing synthesis and placement transforms.

With this structure, any change in the location of the logic gate need not be exact, only an a bin location is sufficient. Hence, only the capacity (usage) of the bin roughly needs to be known and monitored.

Referring to FIG. 3, an exemplary infrastructure 300 is shown for implementing the method invention described above.

First, a bin-based interface 301 (which is the SPI interface of FIG. 2) of placement image for placement/synthesis which provides an ability to maintain consistent data between placement and synthesis views. That is, such an interface 301 allows adding logic circuits to bins (e.g., bin database 302/201), removing logic circuits from bins, maintaining capacity and usage of bins, etc. An efficient interface is necessary for the transformations to query and modify the bin structure. The interface 301/201 allows one to perform the following queries: modifications of the bin database, assigning objects to bins, removing objects from bins, verifying space in bins, getting the bin of an object, getting the number of boxes in a bin, iterating through the gates in a bin, etc.

The implementation of interface 202/301 manages information regarding the total area available in the bins, the area used in the bins, the wiring space available in the bins, wiring space used, the blocked areas in a bin etc. In addition it is assumed that information regarding the image is available to the interface only, but not to the transformations. All transformations access and modify placement data through the interface 202/301. This provides an easy and efficient way to handle image data.

Further, bin placement-enabled drivers 303, that control application of transforms based on bin capacity (e.g., namely, bin-enabled critical and noncritical which work on the timing critical and non-critical parts of the netlist respectively. Drivers 303 are developed to run standard synthesis transforms on critical or noncritical regions of a netlist in the context of placement data.

Specifically, the drivers 303 are modified to handle new requirements. They ensure addition and deletion of netlist objects are consistent with placement interface and database. The drivers 303 are designed to control synthesis transformations and ensure the changes to the design are consistent with the existing placement and the image. For example, they prevent a synthesis transform from overfilling a bin, which would lead to illegal placement.

Additionally, a driver 304 for selective bin traversal (e.g., bypassing congested bins, etc.) is provided. That is, this driver(s) is developed to traverse the bins. For example, one may traverse bins which are full to a certain capacity, one may traverse bins which are congested, or empty. One may also traverse the neighboring bins of a given bin.

Further, there is a unit 305 for creating and accessing the bins via placement cuts (both active and null cuts). A cut is performed to increase the number of bins in a design. A cut may be invoked from within a script (unit 206). An active cut would change the placement of logic circuits in a design so as to minimize a cost metric such as total wire length. A null cut on the other hand would be performed on an existing placed design and would not disturb the existing placement. Both active cuts and null cuts increase the number of bins (and therefore bin size), but only the former changes the existing placement.

Further, there is a unit 306 comprising the timing subsystem based on bin locations. There is also a unit 307 comprising the congestion analysis subsystem based on bins. Units 308, 309 and 310 are examples of novel fine-grained transforms.

For example, there is a fine-grained transform unit 308 for placing sizeless cells which have only gain values assigned to them. The size of the cell (an electrical optimization) is determined only after the placement (a physical optimization) has progressed to a certain status. This is possible since exact locations are not important. Thus, as long as bin capacity is maintained, an estimate of size is sufficient.

Another fine-grained transform example, unit 309 is provided for setting net weights based on logical effort (e.g., logic complexity). This is possible since placement can be interrupted at various points in the design process flow.

Additionally, there is a unit 310 for shrinking and expanding of cells to tradeoff future optimizations such as clock and scan optimization. This is possible because of the bin concept since precise sizes and locations are not important early in placement process.

As alluded to above, in the present invention, a bin-based placement image is selected since it can be efficiently updated and can gradually represent more precise placement information.

The placement data of a design needs to be represented at a variable level of abstraction. On one hand, the cell placement must be represented precisely enough to provide accurate information to the analyzers (e.g., the timing and congestion analyzers). On the other hand, one does not want to spend a lot of time updating detailed placement information that does not have a major impact on the analysis results.

Further, an efficient interface is needed for such an abstraction 313. The requirements of such an interface are that it should allow and provide for interspersing placement and synthesis transforms on a fine grained level, the transforms should be able to manipulate synthesis, placement timing and routing data on a consistent database, suitable interfaces should be available maintaining and updating data, suitable interfaces should exist for applying arbitrary synthesis transforms, suitable interfaces should exist for selecting regions in the image to apply the transforms, support for a mechanism to invoke algorithms in intermediate steps of placement and synthesis, support to invoke such algorithms in the form of scenarios scripts, and support to automatically invoke timing at the given level of the abstraction (e.g., callbacks on place records).

Additionally, controllers 311 and 312 are provided for management of bin-based placement synthesis data and timing data, etc., and used in steps 204 and 205. An example would be callbacks on timing with changes in bin center locations. "Callbacks" occur when the timing of the circuit must updated. That is, callbacks occur to update the bins (e.g., timing of the design, etc.). Specifically, when many changes are made to the design, typically the timing of the design will change, and thus callbacks provide an updating mechanism.

There are primarily two types of callbacks in the placement synthesis system. The first set provides a mechanism to interrupt the placement/synthesis flow (in steps 204 and 205) to invoke fine grained transformations shown in steps 206 and 207. The process is interrupted at various stages of the placement synthesis process. The callback in turn invokes a scenario which performs optimizations on the design. After the scenario is complete, the placement process continues and reacts to the changes made by the transformations. This callback mechanism is shown as unit 311.

The second set of callbacks keep the timing analyzer in sync with changes to the netlist and placement locations. The changes in placement locations may be due to partitioning cuts or due to the synthesis transformations. The timing callback mechanism based on bins is shown as unit 312 and used in step 205.

Figure 4:
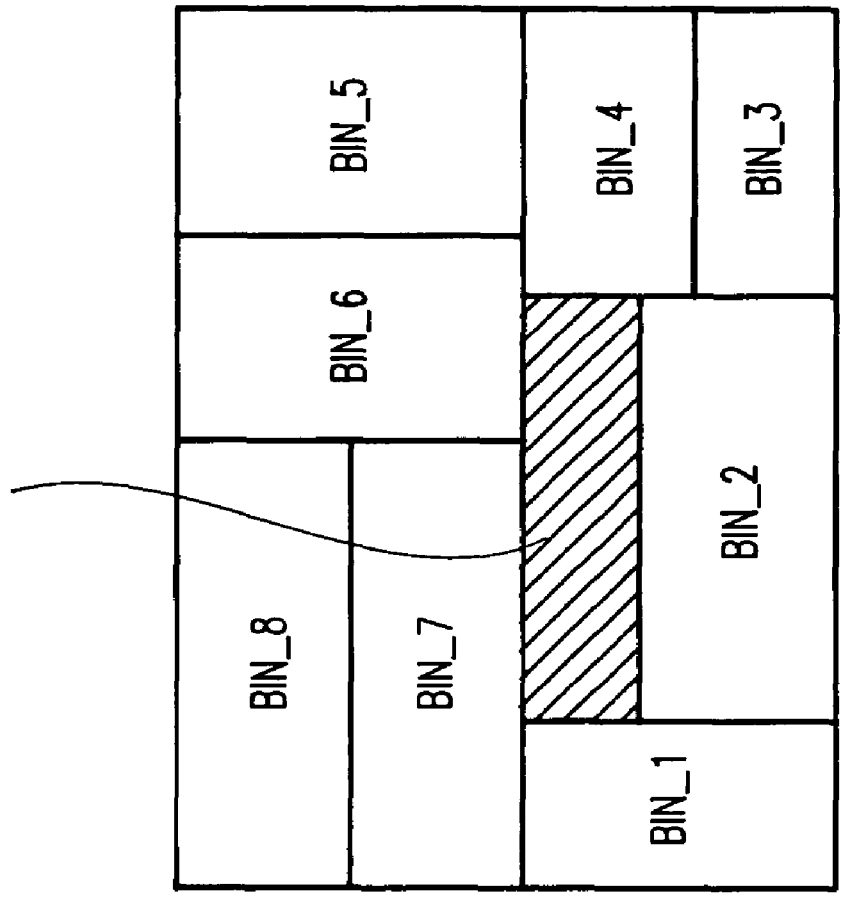
FIG. 4 illustrates a coarse image view.

FIG. 4 illustrates that the chip/design area is divided into bins. As mentioned above, only abstracted information is maintained with respect to each bin. Each bin has associated with it a certain cell capacity and wiring capacity. Other metrics related to manufacturability, yield and noise also may be considered. Circuits can be moved between the bins without a complex legalization procedure. Instead, the invention tracks a simpler measure of how much of the bin capacity is used up by circuits already placed in the bin.

The bin structure has functions that relate to the physical characteristics of the chip image, where and how many circuit locations are available, where I/Os are placed, where partitions are placed, block space for other circuits, where power lines are placed and how they block other wiring, etc. This information is sufficient to ensure that a legal detailed placement can be obtained and that the wire-ability metrics for the routing are met.

The bins can have any size. The smaller the bins, the more precise the placement of the cells in this bin. Eventually, each bin could contain one cell and the cell will be fixed in the location of the bin. In the case of detailed locations, the circuits have exact legal locations for a given chip image and the circuit rows and wiring tracks are exactly defined.

The bin structure is especially beneficial in a synthesis/physical design environment where significant changes are made to the design and maintaining legal locations for detailed placement would be expensive. The bin structure optimally supports the optimization flow of the invention, where more drastic restructuring decisions are made up-front, and smaller decisions, supported by more precise analysis information later. Gradual refinement of the bins will create gradually more precise wire-length estimates and better timing and noise analysis, and the like.

The bin structure may be applied on the design by a partitioner transform. The bin structure may be applied in two ways.

First, a bin structure may be applied on an unplaced design by a partitioner transform. The bias boundaries are defined and updated by the cut applied by the placement. The bin sizes get smaller as the placement progresses. The dominant flow during most placements is that of the traditional bipartitioning placement methodology. In this flow, the starting point is a netlist including fixed and movable circuits, along with floor planning constraints such as primary IO port assignments, reserved areas, capacitance targets, and areas assigned for a special set of logic circuits. At this point, the movable objects have no placement locations.

Conventional placement in the bipartitioning methodology uses a partitioner to separate the movable objects into two partitions defined by a dividing line (e.g., cut line) that splits the chip into two halves. Each chip half now constitutes a partition. The objects for each partition are selected so as to minimize the total number of wires that cross the cut line, and so that the amount of circuit area and connections in each partition are approximately equal. At this point, there are twice the number of bins as earlier. In conventional placement, this step is repeated recursively until the placement completes.

In the inventive methodology, the partitioner is available as a separate transform to the placement/synthesis flow and may be selectively applied when it is necessary to double the number of bins in a design. Such a partitioner transform can be applied at various stages of placement/synthesis flow, thereby increasing the number of bins as the flow progresses. As more bins are created, more precision in the design results.

The input to the system may be a placed design. In this case, the partitioner cannot move the objects in the designs during the partitioning. Instead it performs "null" cuts, which means that although the design is partitioned, the objects are not moved. The objects are assumed fixed during partitioning. Therefore, the partitioning only creates bins and assigns objects to them, without disturbing the existing placement.

The placement/synthesis flow shown in FIG. 2 can be interrupted at various points while invoking a series of fine-grained synthesis/placement transformations so as to update the bin structure and the timing. On each cut of the placement program, a callback can be initiated. As mentioned above, the callback in turn updates the bin database structure, updates timing analysis and initiates the necessary scripts (scenarios) where the synthesis/placement transformations are invoked.

Timing analysis is based on the bin concept. Standard Steiner estimation techniques implemented within a static timing analysis engine are modified to: 1) use the bin centers as the locations of the object to compute Steiner trees; 2) update the locations of the objects and hence the Steiner trees as the number of bins are increased; 3) trigger timing callbacks based on changes to locations of objects; 4) estimate the wire lengths within a bin-based on Rent Rule; and 5) the total wire load is computed as a sum of the Steiner tree plus the wire load within the bins.

The flexibility of the transformational approach allows easy development of specific scenarios tuned to take advantage of a converging design process. Accuracy versus runtime tradeoff for various transformations can be selected as the quality of the placement and netlist data improves in a converging flow. Such scenarios can be developed to target a variety of metrics including noise, yield and manufacturability. The scenario presented hereinbelow specifically targets timing optimization while maintaining the wirability metrics.

In the system of the present invention, technology-independent optimization, technology mapping and the early part of the timing optimization stage (e.g., where coarse optimization is performed) employ a gain-based (e.g., load-independent) delay model.

As a result, the effect of wire load models on area-delay tradeoffs performed is minimized. The later part of timing optimization, where detailed and aggressive optimization is performed, is integrated with transformational placement. Global optimization transforms are employed in the initial stages of the design process. In contrast, local and detailed optimization transforms which tend to cause very minor perturbations to the design, are used in the later stages of the design process.

At any point during the process, the progress of placement is measured by the size of the placement bins (e.g., the larger the size of the bins, the later the placement stage). The Partitioner transform is invoked to convert an existing placement to one with bins of desired size. The Partitioner provides the status or progress of the placement by providing a number (e.g., exemplarily between 0 and 100) based on the bin sizes. Low numbers imply initial stages of placement while higher numbers are returned for later stages. At any time, the Partitioner may be invoked with a target status number greater than the existing status number. At that time, the Partitioner will then proceed with placement and attempt to bring the design into a state with status numbers close as possible to the target status number.

The Reflow transform, which allows logic circuits to move across partitions so as to reduce the total wire length, is typically invoked after the Partitioner to improve the placement. In the approach of the present invention, the placement is allowed to advance in steps of a specified number and selectively apply transforms once the desired state of placement is reached. The step size may be user-specified or derived from the design size and other properties.

Figure 5:
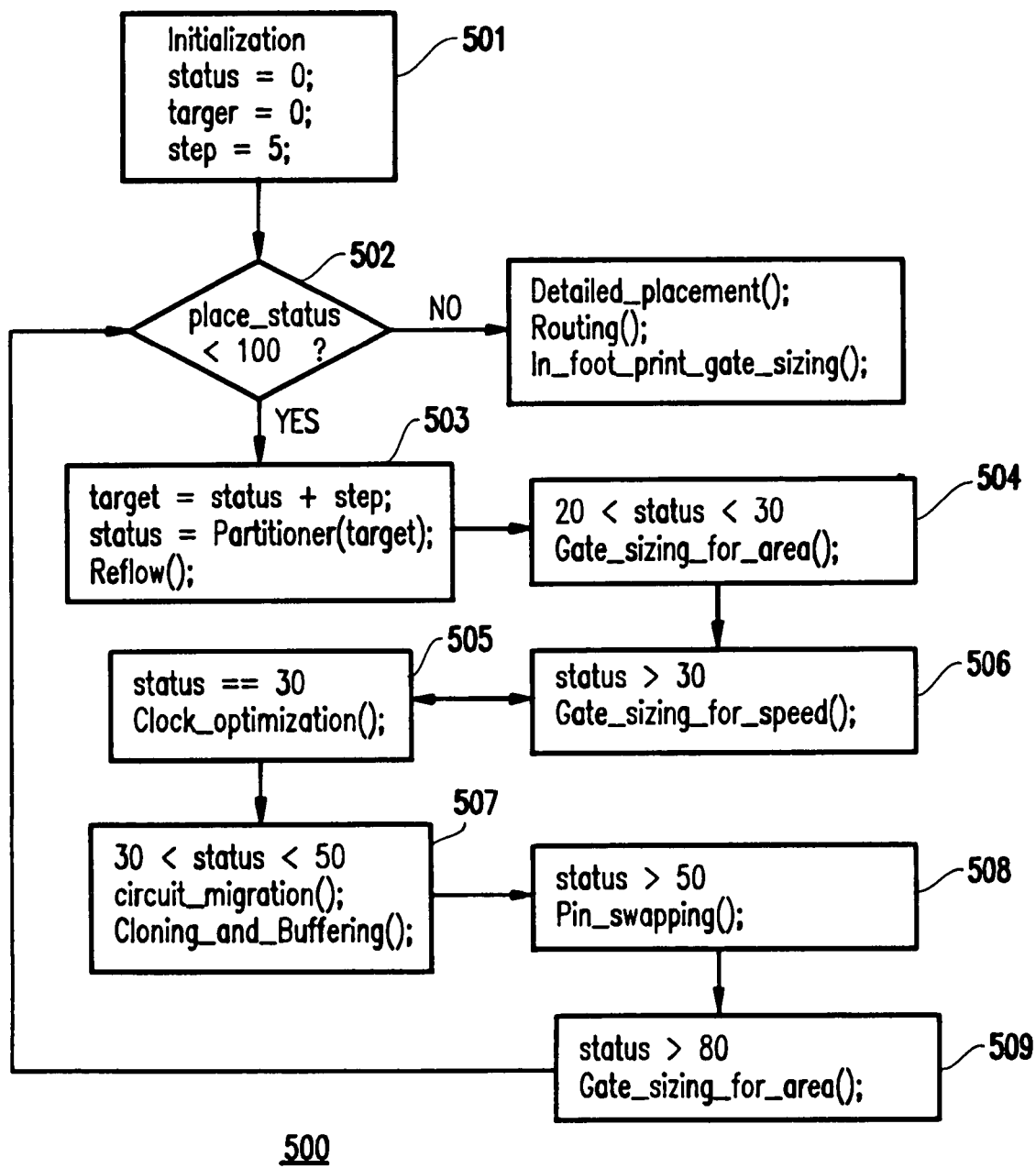
FIG. 5 illustrates an exemplary optimization flow chart.

Referring to FIG. 5, an exemplary scenario 500 is shown which provides a high level description of the optimization process. The invention provides a flexible method to allow various scenarios to be developed. The advantage of the fine-grained transformational approach described in the invention is the flexibility of developing a wide range of scenarios of which FIG. 5 is only one example. Such an examplary scenario is described further.

First, in step 501, the timing analyzer, wire length calculator, and clock tree optimizer are initialized.

In step 502, the placement status range is determined. The placement status range at the beginning of some blocks gives the condition under which that block is executed. For example, a Circuit Migration transform is applied only if the status is between 30 and 50 (e.g., step 507). In contrast, Clock Optimization is performed only once when the status is 30 (e.g., step 505).

If "YES" in step 502, the process continues to step 503. During the initial stages of the flow, gate sizing is performed in the non-critical regions of the design to recover area, as more realistic wire loads are available (e.g., step 504).

The clone transform which makes cloned copies of gates to distribute load, and the buffer insertion transforms are applied during the middle stages of placement (e.g., see step 507). It is noted that clone and buffer insertion transforms attempt to avoid overlap and congestion while assigning locations to the newly created gates. These transforms also utilize a circuit relocation transform to create space for the newly created gates.

The output of this system is a finally synthesized and legally placed design that can be input to the routing tool. Post-routing, a final in-foot-print gate sizing (which does not disturb placement or routing) is performed to compensate for mismatches in actual and Steiner tree predicted routing.

FIG. 6 illustrates a typical hardware configuration of an information handling/computer system 600 in accordance with the invention. The computer system 600 preferably has at least one processor or central processing unit (CPU) 611.

The CPUs 611 are interconnected via a system bus 612 to a random access memory (RAM) 614, read-only memory (ROM) 616, input/output (I/O) adapter 618 (for connecting peripheral devices such as disk units 621 and tape drives 640 to the bus 612), user interface adapter 622 (for connecting a keyboard 624, mouse 626, speaker 628, microphone 632, and/or other user interface devices to the bus 612), a communication adapter 634 for connecting an information handling system to a data processing network, the Internet, an Intranet, etc., and a display adapter 636 for connecting the bus 612 to a display device 638 and/or printer 639.

In addition to the hardware/software environment described above, a different aspect of the invention includes a computer-implemented method for performing the above method. As an example, this method may be implemented in the particular environment discussed above.

Such a method may be implemented, for example, by operating a computer, as embodied by a digital data processing apparatus, to execute a sequence of machine-readable instructions. These instructions may reside in various types of signal-bearing media.

Thus, this aspect of the present invention is directed to a programmed product, including signal-bearing media tangibly embodying a program of machine-readable instructions executable by a digital data processor to perform the above method.

Thus, as shown in FIG. 7, in addition to the hardware and process environment described above, a different aspect of the invention includes a computer-implemented method of applying fine-grained transforms during placement synthesis interaction. As an example, this method may be implemented in the particular hardware environment discussed above.

Such a method may be implemented, for example, by operating the CPU 611 (FIG. 6), to execute a sequence of machine-readable instructions. These instructions may reside in various types of signal-bearing media.

The signal-bearing media may include, for example, a RAM contained within the CPU 611, as represented by the fast-access storage for example. Alternatively, the instructions may be contained in another signal-bearing media, such as a magnetic data storage diskette 700 (FIG. 7), directly or indirectly accessible by the CPU 611.

Whether contained in the diskette 500, the computer/CPU 611, or elsewhere, the instructions may be stored on a variety of machine-readable data storage media, such as DASD storage (e.g., a conventional "hard drive" or a RAID array), magnetic tape, electronic read-only memory (e.g., ROM, EPROM, or EEPROM), an optical storage device (e.g. CD-ROM, WORM, DVD, digital optical tape, etc.), paper "punch" cards, or other suitable signal-bearing media including transmission media such as digital and analog and communication links and wireless. In an illustrative embodiment of the invention, the machine-readable instructions may comprise software object code, compiled from a language such as "C", etc.

With the unique and unobvious features of the present invention, the transformational placement and synthesis approaches of the conventional techniques are dramatically improved upon. That is, by creating a sequence of more and less granular placement and netlist modification transforms a converging design closure process is created, starting from just a netlist without initial placement.

The placement function is preferably decomposed into a set of placement transforms each addressing a specific phase of the placement problem. Each placement step becomes just another transform that changes the design space, in this case the placement of cells. These placement transforms can be freely mixed and matched with the traditional logic synthesis transforms that change the netlist. The accuracy versus runtime tradeoff of these optimizations can be refined as the quality of the placement and netlist data improves in a converging flow.

Thus, a single step may optimize the physical, boolean and electrical dimensions, thus moving a design efficiently from a start point to an end, optimal point in the design space. Multiple steps are not required. Thus, in the inventive method and system, a buffer insertion step may optimize multiple objectives simultaneously (e.g., by choosing the physical locations of the sinks and sources, the sizes and electrical gains of the buffers and the topology of the buffer tree, etc.).

Hence, the present invention is optimized in efficiency and reducing the computation and expenditure of system resources.

Additionally, in the invention, the placement and logic redesign are not alternate steps in an iteration. Instead, a single fine grained step may include multiple objectives and constraints which involve both physical (placement) and logical data. Further, the invention does not necessarily make any distinction between a placement and synthesis step. Any step may move the circuit from one design space (physical, electrical and logical) to another. Hence, with the invention, a partially placed and synthesized design can be the starting point. Along these lines, an incremental netlist and physical design improvement can be made using the invention.

Further, in the invention, the flow is a single converging flow of successive application of fine grained step as opposed to an iteration of partial placement and partial logic redesign steps. Further, the invention is preferably based on the infrastructure of bins, which allow for quick logic redesign during placement. Moreover, the timing analysis method is based on the bin concept. The invention also allows for externally controlling the logic/placement redesign using scenarios.

Further, as mentioned above, placement and netlist changes (synthesis) are performed together in the form of fine grained transforms. Flexible scenarios may be built using the fine-grained transforms to create a converging design process flow. Timing verification is internal to both the placement and synthesis algorithms leading to a converging placement/netlist change flow.

Hence, the invention performs placement and netlist changes concurrently. The placement program of the invention is incremental in nature and at every step, a range of placement and netlist change transforms can be applied (that are more effective than net weighting), for improving the design.

Finally, the invention does not merely perform only placement changes, but improves metrics such as timing, noise, area and power constructively by concurrently applying both placement and netlist changes.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. A computer-implemented method of applying fine-grained transformations during placement synthesis interaction, said method comprising:
  creating and updating of bins;
  applying the transforms on a bin-based database updated by both placement and synthesis based on an infrastructure;
  updating a timing of the applying of the transforms;
  invoking a synthesis-placement script;
  selecting fine-grained synthesis and placement transforms;
  invoking the selected transforms within the synthesis-placement script; and
  applying transforms that change the physical, electrical, and Boolean domains concurrently.

2. The method claimed in claim 1, further comprising:
  moving a design space from one point to another by considering concurrently subsets of fine-grained physical transforms, electrical transforms, and Boolean transforms; and repeating the method until design convergence is achieved.

3. The method claimed in claim 2, wherein blocks of each of the physical optimizations, electrical optimizations, and Boolean optimizations are interspersed together.

4. The method claimed in claim 3, wherein each of said optimizations is represented as a plurality of transformations, such that the optimizations are divided and interspersed together, to examine each of the physical domains, electrical domains, and Boolean domains concurrently.

5. An apparatus for applying fine-grained transformations during placement synthesis interaction, said apparatus comprising:
   a unit for creating and updating of bins;
   a unit for applying the transforms on a bin-based database updated by both placement and synthesis based on an infrastructure;
   a unit for updating a timing of the applying of the transforms;
   a unit for invoking a synthesis-placement script;
   a unit for selecting fine-grained synthesis and placement transforms;
   a unit for invoking the selected transforms within the synthesis-placement script; and
   a unit for applying transforms that change the physical, electrical, and Boolean domains concurrently.

6. The apparatus claimed in claim 5, further comprising a unit for moving a design space from one point to another by considering concurrently subsets of fine-grained physical transforms, electrical transforms, and Boolean transforms.

7. The apparatus claimed in claim 6, wherein blocks of each of the physical optimizations, electrical optimizations, and Boolean optimizations are interspersed together.

8. The apparatus claimed in claim 7, wherein each of said optimizations is represented as a plurality of transformations, such that the optimizations are divided and interspersed together, to examine each of the physical domains, electrical domains, and Boolean domains concurrently.

9. A machine-readable medium having stored thereon at least one sequence of instructions that, when executed, causes a machine to perform a method of applying fine-grained transformations during placement synthesis interaction, wherein the instructions when executed are configured to perform:
   creating and updating of bins;
   applying the transforms on a bin-based database updated by both placement and synthesis based on an infrastructure;
   updating the a timing of the applying transforms;
   invoking a synthesis-placement script;
   selecting fine-grained synthesis and placement transforms;
   invoking the selected transforms within the synthesis-placement script, using a driver; and
   applying transforms that change the physical, electrical, and Boolean domains concurrently.

10. The machine-readable medium claimed in claim 9, wherein the instructions are configured to further perform moving a design space from one point to another by considering concurrently subsets of fine-grained physical transforms, electrical transforms, and Boolean transforms; and
   repeating the method until design convergence is achieved.

11. The machine-readable medium claimed in claim 10, wherein blocks of each of the physical optimizations, electrical optimizations, and Boolean optimizations are interspersed together.

12. The machine-readable medium claimed in claim 11, wherein each of said optimizations is represented as a plurality of transformations, such that the optimizations are divided and interspersed together, to examine each of the physical domains, electrical domains, and Boolean domains concurrently.

* * * * *